United States Patent [19]
Onishi

[11] Patent Number: 5,708,284
[45] Date of Patent: Jan. 13, 1998

[54] NON-VOLATILE RANDOM ACCESS MEMORY

[75] Inventor: Shigeo Onishi, Nara, Japan

[73] Assignee: Sharp Kabushiki Kaisha, Osaka, Japan

[21] Appl. No.: 615,891

[22] Filed: Mar. 14, 1996

[30] Foreign Application Priority Data

Mar. 20, 1995 [JP] Japan ................................. 7-061115

[51] Int. Cl.$^6$ ............ H01L 29/76; H01L 29/94; H01L 31/062; H01L 31/113
[52] U.S. Cl. ............ 257/295; 257/298; 257/300
[58] Field of Search ............ 257/295, 296, 257/300, 324, 532, 298, 306; 365/145

[56] References Cited

U.S. PATENT DOCUMENTS

| | | | |
|---|---|---|---|
| 4,888,630 | 12/1989 | Paterson | 257/295 |
| 5,046,043 | 9/1991 | Miller et al. | 257/295 |
| 5,229,309 | 7/1993 | Kato | 257/295 |
| 5,300,799 | 4/1994 | Nakamura et al. | 257/295 |
| 5,303,182 | 4/1994 | Nakao et al. | 257/295 |
| 5,416,735 | 5/1995 | Onishi et al. | 257/295 |
| 5,440,173 | 8/1995 | Evans, Jr. et al. | 257/295 |
| 5,495,117 | 2/1996 | Larson | 257/295 |
| 5,498,888 | 3/1996 | Ozawa | 257/295 |
| 5,559,733 | 9/1996 | McMillan et al. | 257/295 |

FOREIGN PATENT DOCUMENTS

| | | | |
|---|---|---|---|
| 3-32066 | 2/1991 | Japan . | |
| 5-90532 | 4/1993 | Japan . | |
| 5-90607 | 4/1993 | Japan . | |
| 5-145077 | 6/1993 | Japan . | |
| 5136377 | 6/1993 | Japan | 257/295 |
| 5347391 | 12/1993 | Japan | 257/295 |

Primary Examiner—Sara W. Crane
Assistant Examiner—Phat X. Cao
Attorney, Agent, or Firm—Nixon & Vanderhye P.C.

[57] ABSTRACT

A non-volatile random access memory comprises a memory cell including: a MOS transistor having a gate insulation film formed on a semiconductor substrate, a gate electrode, and a pair of impurity diffusion layers; and an MFS transistor having at least a bottom gate electrode, a ferroelectric film, a top electrode, and a pair of impurity diffusion layers, one of the impurity diffusion layers of the MFS transistor being shared with the MOS transistor and connected to a portion of the bottom gate electrode; wherein the MOS transistor is connected to a bit line and a word line, and the MFS transistor is connected to a drive line and a common source line.

8 Claims, 10 Drawing Sheets

NON-VOLATILE RANDOM ACCESS MEMORY

BACKGROUND OF THE INVENTION

1. Field of the Invention

The present invention relates to a non-volatile random access memory and, more particularly, to a low-power-consumption, high-speed non-volatile random access memory (RAM) using a ferroelectric film.

2. Description of the Prior Art

Typical randomly accessible memory devices include an SRAM (static random access memory) and a DRAM (dynamic random access memory), which are volatile memories. The former requires six transistors for one memory cell, thereby imposing a limitation on higher integration. The latter suffers from an increased power consumption because capacitors thereof require periodical refreshing for data retention.

Recently, FRAMs (ferroelectric random access memories) employing a ferroelectric film as a capacitor dielectric film thereof have been attracting increasing attention. The cross section and circuit arrangement of a typical FRAM are shown in FIGS. 14 and 15, respectively.

Figure 14:
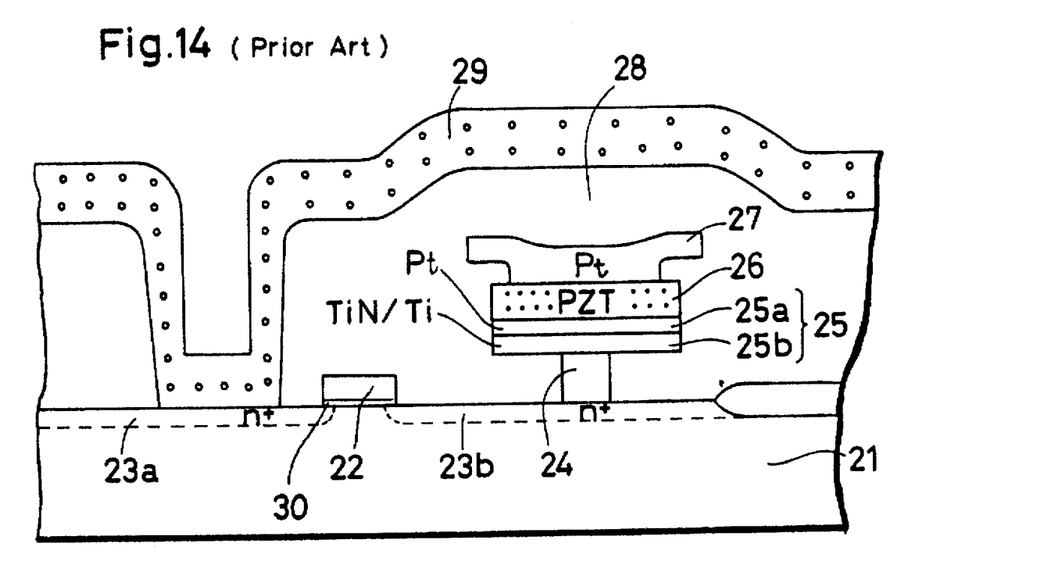
FIG. 14 is a schematic sectional view illustrating a memory cell of a conventional FRAM.
Figure 15:
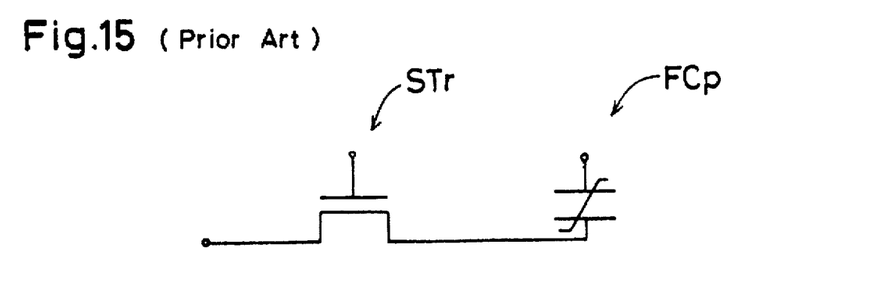
FIG. 15 is an equivalent circuit diagram illustrating the memory cell of the conventional FRAM.

Referring to FIGS. 14 and 15, the FRAM comprises a memory cell essentially consisting of a select transistor STr and a ferroelectric capacitor FCp. The select transistor STr includes a gate electrode 22 formed on a semiconductor substrate 21 with intervention of an insulating film 30, and a pair of impurity diffusion layers 23a and 23b. The ferroelectric capacitor FCp includes a bottom electrode 25 formed of lamination of a platinum (hereinafter Pt) film 25a and a titanium nitride over titanium (TiN/Ti) film 25b, a lead zirconate (hereinafter PZT) film 26 serving as a ferroelectric film, and a top electrode 27. One of the impurity diffusion layers 23a of the select transistor STr is connected to a bit line 29, and the other impurity diffusion layer 23b is connected to the bottom electrode 25 of the ferroelectric capacitor FCp through a contact plug 24 made of polysilicon.

The unit memory cell of the FRAM thus arranged is of a simple construction having one select transistor STr and one ferroelectric capacitor FCp connected to the select transistor STr as shown in FIG. 15, thereby expected to provide for high integration comparable to the DRAM.

Figure 16:
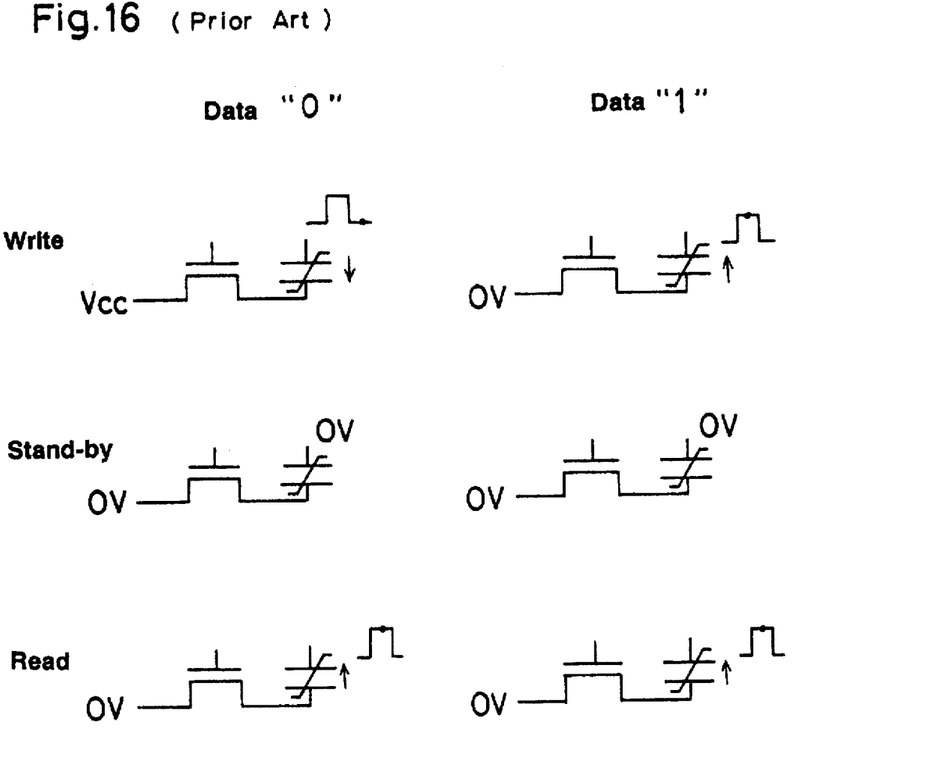
FIG. 16 is an equivalent circuit diagram for explaining the operation of the conventional FRAM.

The principle of operation of the FRAM is described below with reference to FIG. 16.

During a data write operation, the bit line is at a Vcc level (power supply voltage level) or a ground level, and the select transistor STr is turned on. A pulse is applied to a drive line to create two different polarization states in the capacitor. More specifically, data "0" or "1" is written into the memory cell.

During standby, the bit line and drive lines are kept at the ground level.

During a data read-out operation, the bit line is at the ground level and the select transistor STr is turned on. A pulse is applied to the drive line to cause polarization inversion in the capacitor with the data "0" but not to cause polarization inversion in the capacitor with the data "1". Thus, data identification is achieved by sensing, during this operation, the difference in the electric current which varies depending on whether the data is "1" or "0".

Unfortunately, the aforesaid FRAM in which data are broken during the data read operation requires a rewrite operation. Further, the polarization inversion in the capacitor in both of the data write and read operations requires high power consumption and complicated data access timing. Additionally, it is difficult for the FRAM to operate at a high speed such that the access time is below 100 nsec.

The FRAM in a mega-bit class needs one dummy cell for 128 to 256 memory cells, imposing a problem which hinders higher integration of the memory. Further, the need for more than $10^{13}$ read/write operations in the memory necessitates more than $10^{15}$ data rewrite operations in the dummy cell capacitor. The existing ferroelectric capacitors employ a PZT (lead zirconate titanate) film, the characteristics of which is considerably deteriorated after $10^{12}$ to $10^{13}$ rewrite operations, imposing the problem of film fatigue. To prevent the characteristic. deterioration of the dummy cell, it is necessary to limit the number of rewrite operations of the memory cell to less than $10^{10}$. Another significant problem is an imprint resistance of the dummy cell.

Figure 17:
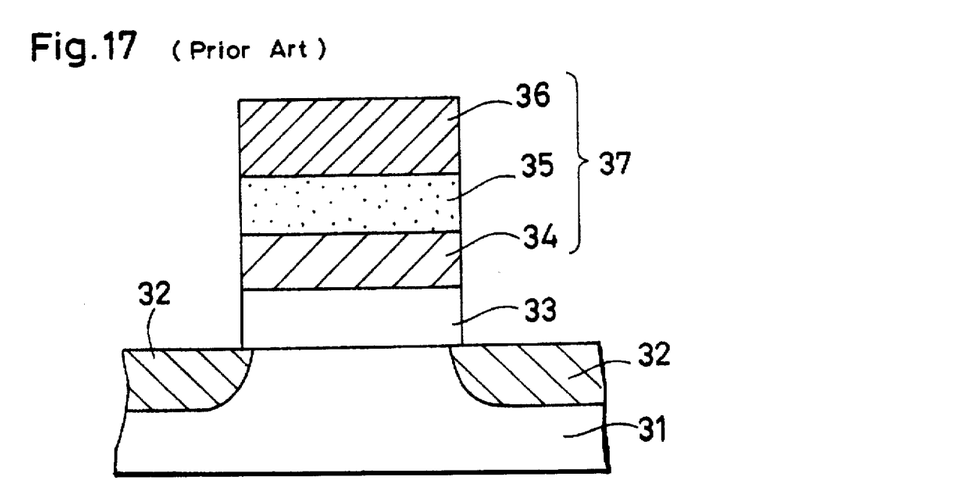
FIG. 17 is a schematic sectional view illustrating a conventional semiconductor device.

To solve such problems, non-destructively readable memory cells are proposed in Japanese Unexamined Patent Publications No. Hei 3 (1991)-32066 and No. Hei 5 (1993)-145077. These memory cells comprise a ferroelectric device portion and an MOS transistor portion as shown in FIG. 17. The ferroelectric device portion 37 includes a bottom electrode 34, a ferroelectric film 35, and a control electrode 36 which are formed on a semiconductor substrate 31 with intervention of an insulation film 33. The MOS transistor portion includes a pair of source/drain regions 32 formed in the semiconductor substrate 31, the insulation film 33 and a gate electrode used commonly with the bottom electrode 34 of the ferroelectric device portion.

In the memory cell, the ferroelectric film 35 is polarized with the potential difference between the semiconductor substrate 31 and the control electrode 36 between which a voltage is applied. The polarization brings the MOS transistor using the bottom electrode 34 as the gate electrode into a conductive state or a non-conduction state for data storage.

The memory cell of FIG. 17 having a capacitance between the bottom electrode 34 and the semiconductor substrate 31 is disadvantageous in that distinct polarization in the ferroelectric film 35 cannot be obtained without a large voltage applied between the semiconductor substrate 31 and the control electrode 36.

Figure 18:
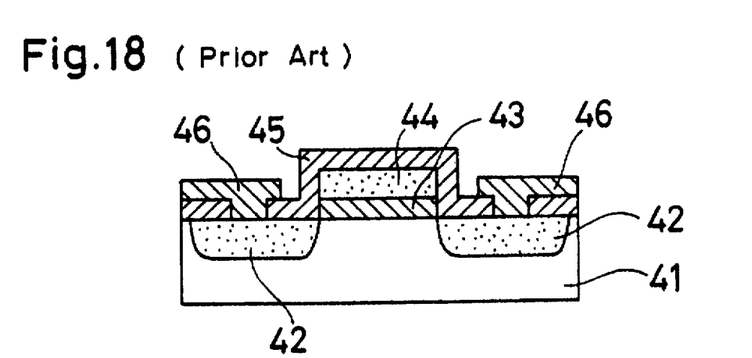
FIG. 18 is a schematic sectional view illustrating a conventional ferroelectric memory.

Another non-destructively readable non-volatile memory is proposed which uses a ferroelectric. As shown in FIG. 18, the non-volatile memory is an MFS (Metal Ferroelectric Semiconductor) field effect transistor having a ferroelectric serving as a gate film, which comprises a conductive thin film serving as a gate electrode 44 formed on a p-type semiconductor substrate 41 with intervention of a ferroelectric gate film 43. The MFSFET further comprises a pair of n-type impurity diffusion layers 42 in a surface portion of the semiconductor substrate 41 with the gate electrode 44 therebetween, an interlayer insulation film 45 formed over the entire surface of the semiconductor substrate 41, and source/drain electrodes 46 connected to the impurity diffusion layers 42 through contact holes formed in the interlayer insulation film 45.

Figure 19:
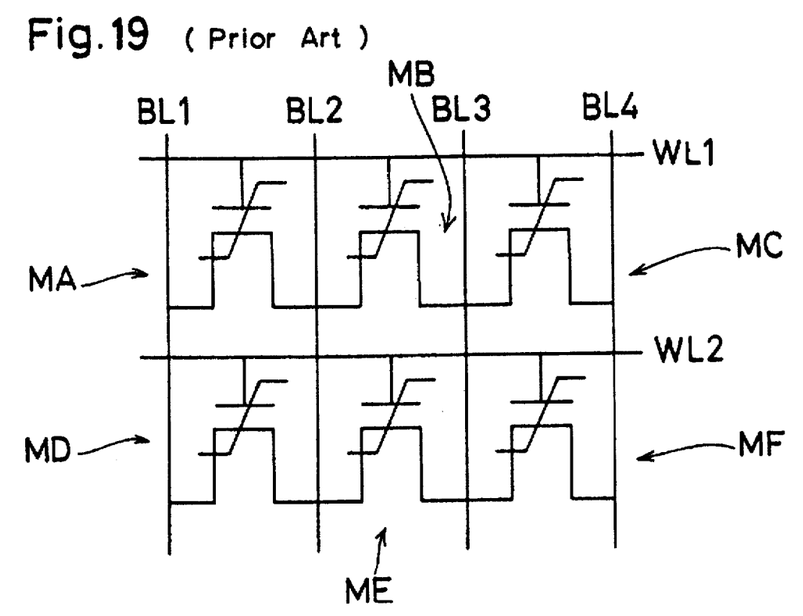
FIG. 19 is an equivalent circuit diagram of the ferroelectric memory of FIG. 18.

The data write and read processes of the MFSFET will be explained with reference to an equivalent circuit diagram shown in FIG. 19.

Memory cells MA, MB, MC, MD, ME and MF each have a MFSFET. The gate electrodes of the MFSFETs of the memory cells MA, MB and MC are connected to a word line WL1, and the gate electrodes of the MFSFETs of the memory cells MD, ME, MF are connected to a word line WL2. The source/drain electrodes of the MFSFETs are connected to bit lines BL1, BL2, BL3, BL4.

Figure 20:
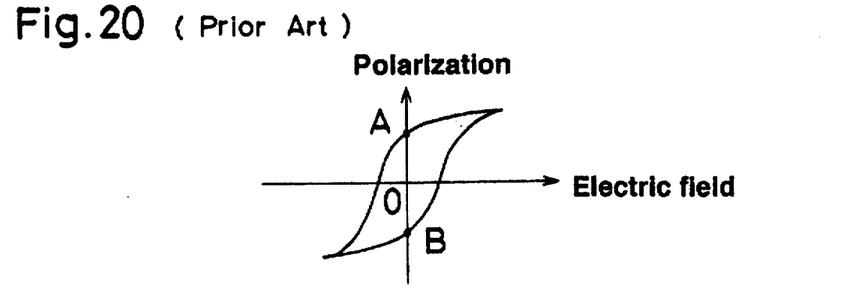
FIG. 20 is a diagram illustrating the polarization state of a ferroelectric.

To read out data stored in the memory cell MD, for example, the word line WL2 is high, and the bit lines BL1 and BL2 are high and low, respectively. The word line WL1, the bit line BL3, and the bit line BL4 are open. When the data stored in the memory cell MD is "0" (indicated by A in the hysteresis loop of FIG. 20), conduction is established between the source and drain to form a channel therebetween, attenuating the bit line BL1 from high to low. When the data stored in the memory cell MD is "1" (indicated by B in the hysteresis loop of FIG. 20), conduction is not established between the source and drain to form no channel therebetween, holding the bit line BL1 high. A sense amplifier (not shown) senses the potential of the bit line BL1 to read out the data stored in the memory cell MD in a non-destructive manner.

To write data into the memory cell MD, the word line WL2 is high, and the bit lines BL1 and BL2 are low. The word line WL1 is low, the bit line BL3 is high at a write inhibit potential level, and the bit line BL4 is open. A potential difference occurs between the gate and drain of the memory cell MD to polarize the ferroelectric gate film. However, since the word line WL1 is low and the bit line BL3 is high at the write inhibit potential level in the memory cell MB, the potential difference might occur between the gate and drain of the memory cell MB, like the memory cell MD, resulting in a change in the polarization state of the ferroelectric gate film of the memory cell MB.

Also proposed is a memory cell having an MFSFET of substantially the same construction as above with a switching MOSFET connected in series between the source/drain of the MFSFET and a bit line. Unfortunately, such an arrangement requires three transistors for each memory cell, resulting in an increased cell size. This makes it difficult to achieve a higher integration level.

Non-destructively readable semiconductor memory devices of another type are proposed in Japanese Unexamined Patent Publications No. Hei 5 (1993)-90532 and No. 5 (1993)-90607. The memory cell of such semiconductor memory devices comprises one field effect transistor and one ferroelectric capacitor in which the gate electrode of the field effect transistor is connected to the bottom electrode of the ferroelectric capacitor with intervention of a wire. A word line is connected to the top electrode of the capacitor, and a bit line is connected to the wire between the bottom electrode of the ferroelectric capacitor and the gate electrode of the field effect transistor.

Figure 21:
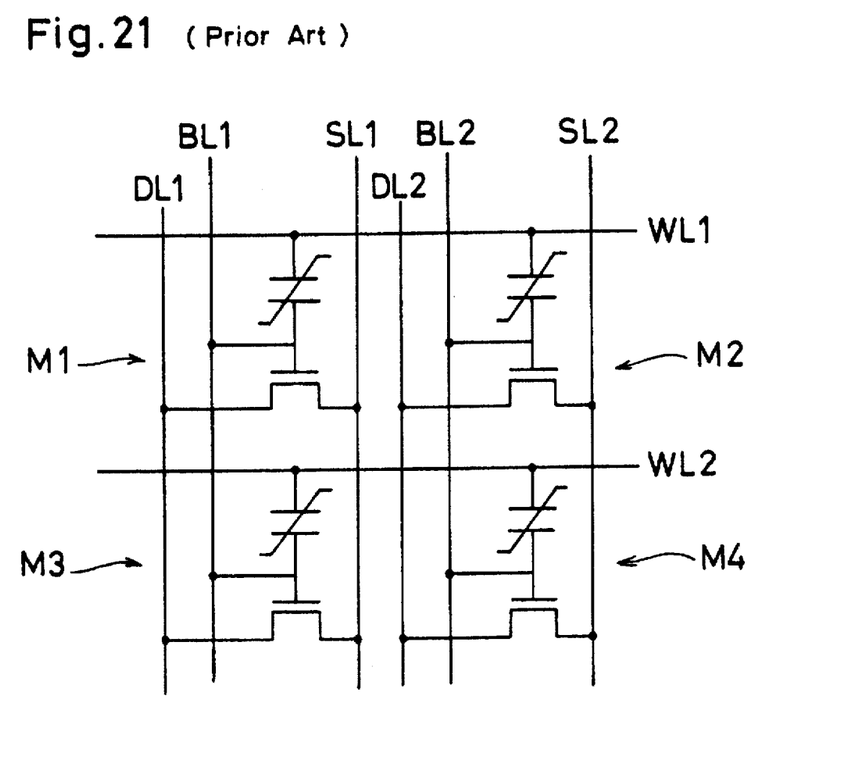
FIG. 21 is an equivalent circuit diagram of another conventional ferroelectric memory.

The data read process for the aforesaid semiconductor device will be described with reference to FIG. 21.

Where data stored in a memory cell M1 is read out, the word lines WL1 and WL2 are low, and the bit lines BL1 and BL2 are open. Drains DL1 and DL2 are high and low, respectively, and sources SL1 and SL2 are low. A sense amplifier senses the potential at the drain DL1 to read out the data stored in the memory cells M1 and M3 in a non-destructive manner. It is therefore difficult to secure the data stored in the memory cell M1.

Further, to rewrite data in the semiconductor device, a voltage greater than a voltage corresponding to a coercive field of the ferroelectric capacitor is applied to the ferroelectric capacitor, which is thereby polarized with a charge level lower than desired remanent charge. This causes a disturbance during the data rewrite operation in accordance with this disclosure.

More specifically, where the memory cells M1, M2, M3 and M4 store therein "1", "1", "1" and "0", respectively, and the data of the memory cell M1 is to be rewritten to "0", a voltage of 5V is applied to the word line WL1 for the selected cell M1 and a voltage of 0V is applied to the bit line BL1 whereas the word line WL2 and the bit line BL2 are fixed at Vcc/2. In this case, the potentials of the word lines for the memory cells M2 and M3 are higher by Vcc/2 than those of the bit lines therefor.

Figure 22:
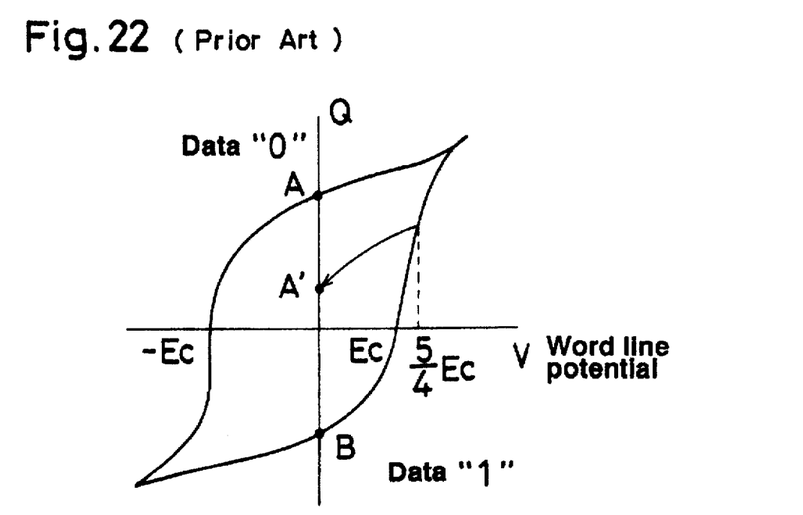
FIG. 22 is a diagram illustrating the polarization state of the ferroelectric memory of FIG. 21.

In general, to allow for stable polarization inversion, the power supply voltage Vcc must be about 2.5 times higher than the voltage Ec corresponding to the coercive field of the ferroelectric capacitor. That is, a voltage (5Ec/4) greater than the voltage Ec is applied to the memory cells M2 and M3 to cause polarization inversion (shown as a B to A' change in FIG. 22), presenting the disturbance problem.

SUMMARY OF THE INVENTION

In accordance with one aspect of the present invention, there is provided a non-volatile random access memory which comprises a memory cell including: an MOS transistor having a gate insulation film formed on a semiconductor substrate, a gate electrode, and a pair of impurity diffusion regions; and an MFS transistor having at least a bottom gate electrode, a ferroelectric film, a top electrode and a pair of impurity diffusion layers, one of the impurity diffusion layers of the MFS transistor being shared with the MOS transistor and connected to a portion of the bottom gate electrode; wherein the MOS transistor is connected to a bit line and a word line, and the MFS transistor is connected to a drive line and a common source line.

In accordance with another aspect of the present invention, there is provided a non-volatile random access memory which comprises a memory cell including: a MOS transistor portion having a gate insulation film and a bottom gate electrode formed on the semiconductor substrate, and a pair of impurity diffusion regions; a ferroelectric capacitor portion, formed on the MOS transistor portion, having the bottom gate electrode serving as a bottom electrode, a ferroelectric film and a top electrode, wherein the bottom gate electrode is connected to one of the impurity diffusion layers.

Thus, the present invention provides a highly reliable, low-power-consumption non-volatile random access memory which ensures a high-speed and low-voltage operation with simple peripheral circuits.

DETAILED DESCRIPTION OF THE PREFERRED EMBODIMENT

A FRAM according to the present invention comprises a memory cell essentially consisting of an MOS transistor and an MFS transistor which are formed on a semiconductor substrate.

The semiconductor substrate in accordance with the present invention is not particularly limited, but may be any of those commonly used as a substrate on which a memory cell is formed. Preferable an example thereof includes a silicon substrate.

In the FRAM according to the present invention, one MOS transistor may serve as a select transistor. The MOS transistor has a gate electrode formed on the semiconductor substrate with intervention of a gate insulation film, and a pair of impurity diffusion layers. The gate insulation film may be of material and thickness typically used for the formation of an MOS transistor. An example of the gate insulation film includes an $SiO_2$ (silicon dioxide) film having a thickness of about 50 Å to about 200 Å. The gate electrode is not particularly limited, but may be formed of a single layer film such as of polysilicon, silicide of W, Ta, Ti, Co, Ni(tungsten, tantalum, titanium, cobalt and nickel, respectively) or the like, or lamination of two or more layers of polycide consisting of the silicide and polysilicon. The thickness of the gate electrode formed of a polysilicon single layer is preferably about 2000 Å to about 4000 Å, and the thickness of the gate electrode formed of the lamination is preferably about 2000 Å to about 4000 Å. The impurity diffusion layers are formed by implanting impurity ions of a conductivity type different from that of the semiconductor substrate to be used, such as As (arsenic) or P (phosphorus), or boron ions in a dose of about 1 to $5 \times 10^{15}$ ions/cm² at an implantation energy of 10 to 80 KeV.

The single MFS transistor for the FRAM according to the present invention essentially consists of an MOS transistor portion and a ferroelectric capacitor portion.

The MOS transistor portion includes a bottom gate electrode formed on the semiconductor substrate with intervention of a gate insulation film, and a pair of impurity diffusion layers. The gate insulation film and bottom gate electrode are not particularly limited, but may be, for example, substantially the same as the gate insulation film and gate electrode of the MOS transistor serving as the select transistor. The pair of impurity diffusion layers may be formed in substantially the same manner as the impurity diffusion layers of the MOS transistor serving as the select transistor. One of the impurity diffusion layers of the MFS transistor is for common use as one of the impurity diffusion layers of the MOS transistor serving as the select transistor. The common impurity diffusion layer is directly connected to a part of the bottom gate electrode.

The size of the MOS transistor portion, the thicknesses of the gate insulation film, bottom gate electrode and the like, and the impurity concentration of the impurity diffusion layers are not particularly limited, but are preferably such that the data writing speed can be suitably controlled.

The ferroelectric capacitor portion is formed on the MOS transistor portion. The ferroelectric capacitor portion includes a bottom electrode which also serves as the bottom gate electrode of the MOS transistor portion, a ferroelectric film formed on the bottom electrode, and a top electrode formed on the ferroelectric film. Alternatively, the ferroelectric capacitor portion includes a conductive film serving as a bottom electrode and formed on the bottom gate electrode, a ferroelectric film formed on the conductive film, and a top electrode formed on the ferroelectric film. The conductive film serving as the bottom electrode is not particularly limited. The conductive film may be any film that can be generally used as an electrode of a ferroelectric capacitor and depending on the needs, may be formed of a film having a good adhesion (contact) property with polysilicon or metal silicide that is used as a gate electrode of a MOS transistor portion, or a lamination film laminated with a barrier metal. Exemplary conductive films to be used include single layer films such as of Ti, Ta, W and Al, silicide thereof, TiN, Pt, Au, Ag, Al, Ni, Pd, Ru, Ir and conductive oxides, and lamination of two or more of these conductive films. More specifically, the conductive film may be of Pt/TiN/Ti (platinum over titanium nitride over titanium), $RuO_2$/Ru (ruthenium dioxide over ruthenium), $IrO_2$/Ir (irridium dioxide over irridium) or the like. The thickness of the conductive film formed of a single layer film is preferably about 500 Å to about 2000 Å. The thickness of the conductive film formed of lamination depends upon the material to be used, but is preferably about 500 Å to about 2000 Å. More specifically, where Pt/TiN/Ti lamination is used, the thicknesses of the Pt/TiN/Ti layers are preferably about 500 Å to 1000 Å, about 500 Å to 2000 Å, and about 200 Å to 500 Å, respectively. Where $RuO_2$/Ru lamination is used, the thicknesses of the $RuO_2$/Ru layers are preferably about 500 Å to 1000 Å and about 200 Å to 500 Å, respectively. Where $IrO_2$/Ir lamination is used, the thicknesses of the $IrO_2$/Ir layers are preferably about 500 Å to 1000 Å and about 200 Å to 500 Å, respectively. Exemplary materials of the ferroelectric film include PZT, PLZT (lead lanthanum zirconate titanate), PNZT (lead niobium zirconate titanate), and bismuth oxides such as $BiSr_2Ta_2O_9$ and $BiSr_2Ta_xN_yO_9$. The thickness of the ferroelectric film may be suitably controlled depending on the material to be used, but is preferably about 1000 Å to about 2000 Å. The top electrode may be of the same material as the bottom electrode, or arbitrarily selected from the exemplary materials for the bottom electrode. The thickness of the top electrode made of a single layer film is preferably about 500 Å to about 2000 Å, and the total thickness of the top electrode made of lamination of two or more layers is preferably about 500 Å to about 2000 Å.

As described above, the MOS transistor serving as the select transistor and the MFS transistor share one of the impurity diffusion layers thereof to be connected to each other. The other impurity diffusion layer of the MOS transistor is connected to a bit line, and the gate electrode thereof is connected to a word line. The other impurity diffusion layer of the MFS transistor is connected to a common source line, and the top electrode of the capacitor portion is connected to a drive line.

Another form of the FRAM according to the present invention comprises a memory cell essentially consisting of the MOS transistor portion and the ferroelectric capacitor portion as described above MFS transistor formed on a semiconductor substrate.

This memory cell corresponds to the aforesaid memory cell which includes no select transistor. In the memory cell, one of the impurity diffusion regions of the MOS transistor portion is connected to the bit line, the other impurity diffusion region is connected to the common source line, and the top electrode of the capacitor portion is connected to the drive line. Description will now be given to an AFRAM (Advanced FRAM) as an embodiment of the non-volatile RAM according to the present invention, a method for fabricating the same, and the principle of operation of the same.

Figure 1:
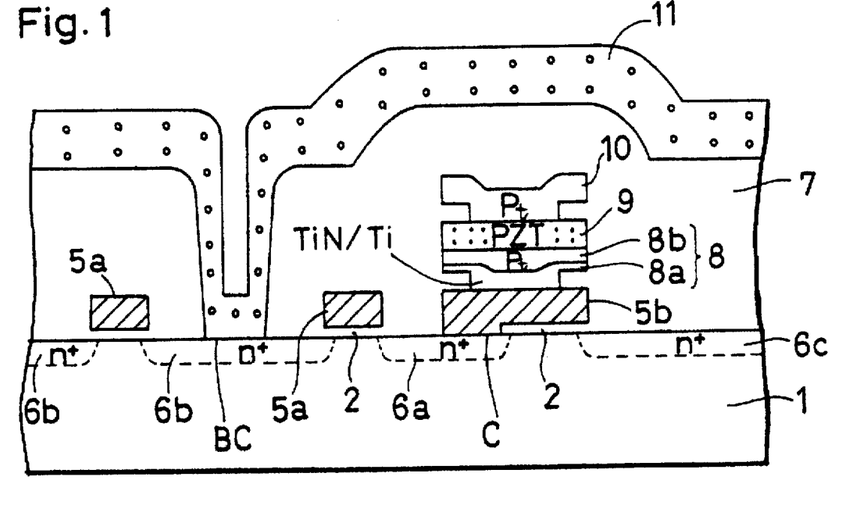
FIG. 1 is a schematic sectional view illustrating a memory cell of an FRAM in accordance with a first embodiment of the present invention.
Figure 2:
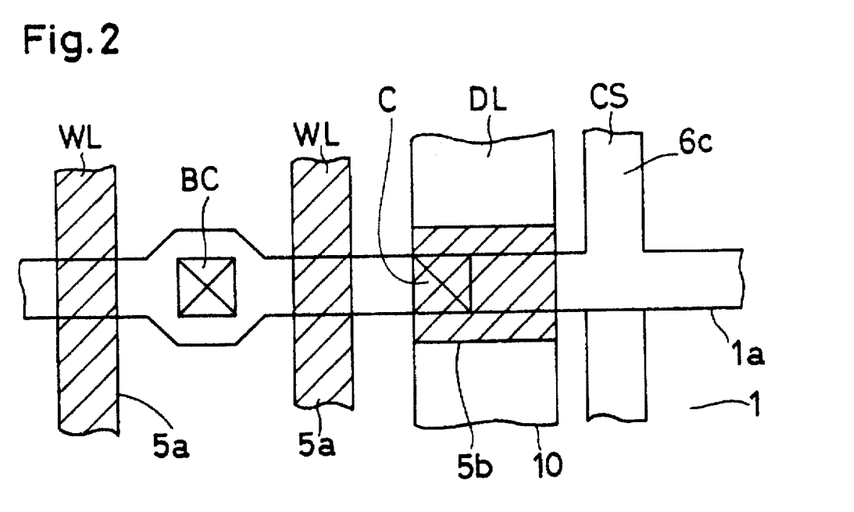
FIG. 2 is a plan view for illustrating interconnections in the memory cell of the FRAM in accordance with the present invention.
Figure 3:
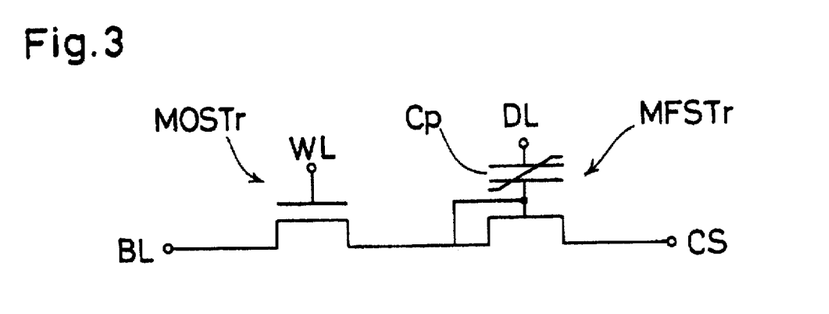
FIG. 3 is an equivalent circuit diagram of the memory cell of the FRAM in accordance with the present invention.

FIGS. 1 to 3 show an FRAM according to a first embodiment of the present invention.

Referring to FIG. 3, the FRAM has a memory cell essentially consisting of an MOS transistor and an MFS transistor. The MOS transistor includes a gate electrode 5a formed in an active region 1a on a semiconductor substrate 1 with intervention of a gate insulation film 2, and a pair of impurity diffusion layers 6a and 6b as shown in FIG. 1. The MFS transistor is formed to share one of the impurity diffusion layer 6a with the MOS transistor. The MFS transistor includes, as well as the impurity diffusion layer 6a shared with the MOS transistor, a bottom gate electrode 5b having a direct connection C with a portion of the impurity diffusion layer 6a and formed on the gate insulation film 2 in a portion other than the connection, and another impurity diffusion layer 6c. A capacitor portion is formed on the bottom gate electrode 5b of the MFS transistor. The capacitor portion includes a bottom electrode 8, a PZT film formed on the bottom electrode 8, and a Pt film 10 formed on the PZT film 9. The bottom electrode 8 has a TiN/Ti film 8a directly connected to the bottom gate electrode 5b, and a Pt film 8b formed on the TiN/Ti film 8a. In the memory thus arranged, as shown in FIG. 2, the impurity diffusion layer 6b of the MOS transistor is connected to a bit line 11 at a bit contact BC, and the gate electrode 5a is connected to a word line WL. The impurity diffusion layer 6c of the MFS transistor is connected to a common source line CS, and the top electrode 10 of the capacitor portion is connected to a drive line DL. In this embodiment, the impurity diffusion region 6c serves as the common source line CS. This increases an RC time constant and might require time to raise voltage. To overcome such a disadvantage, the impurity diffusion region 6c may be made of silicide (TiSix, CoSix) or connected to an Al interconnection.

A method for fabricating the non-volatile RAM will be described with reference to FIGS. 4 to 7.

Figure 4:
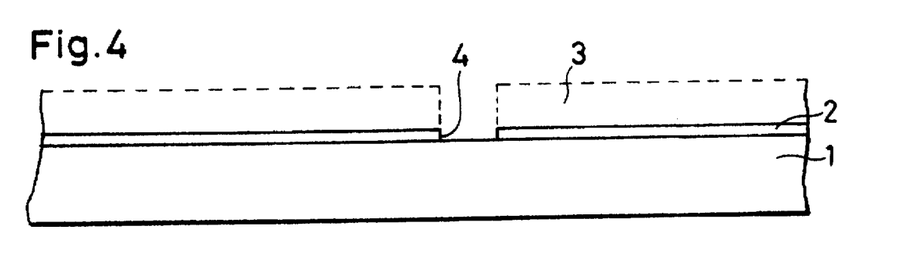
FIGS. 4 to 7 are schematic sectional views for explaining a method for fabricating the memory cell of the FRAM in accordance with the present invention.

First, as shown in FIG. 4, the gate insulation film 2 is formed on the entire surface of the P-type silicon substrate 1. Then, a contact hole 4 is formed in a desired region of the gate insulation film 2 by using a resist mask 3.

Figure 5:
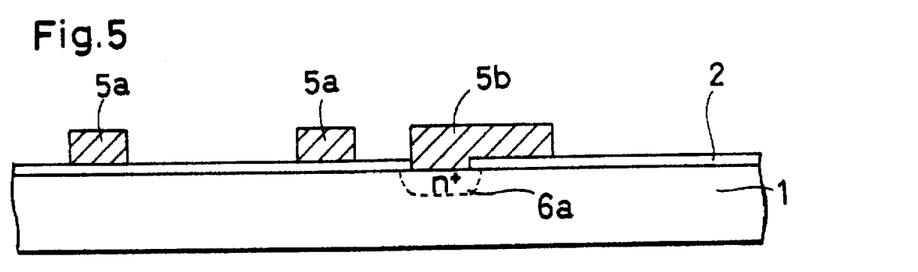

Next, as shown in FIG. 5, an n⁺-polysilicon layer or W polycide layer is formed over the entire surface of the semiconductor substrate 1 and patterned into a desired configuration to form the gate electrode 5a and the bottom gate electrode 5b. The n⁺-polysilicon is formed by phosphorus thermal diffusion or ion implantation. Phosphorus is diffused from the bottom gate electrode 5b formed within the contact hole 4 into the semiconductor substrate 1 to form an ohmic contact. By using the gate electrode 5a and the bottom gate electrode 5b as a mask, impurity ions are implanted into the semiconductor substrate 1, which is annealed to form the impurity diffusion layers 6a, 6b and 6c.

Figure 6:
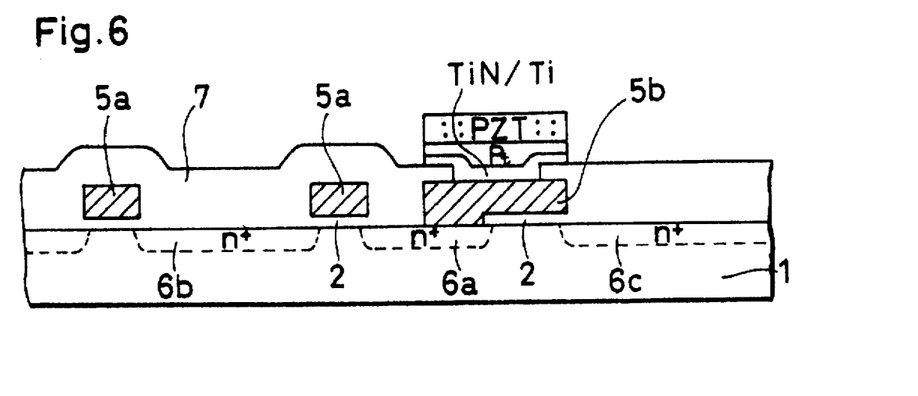

Then, as shown in FIG. 6, an interlayer film 7 of NSG (non-doped silicate glass) is formed over the entire surface of the semiconductor substrate 1 including the gate electrode 5a and bottom gate electrode 5b. A contact hole is formed in the interlayer film 7 on the bottom gate electrode 5b. The TiN/Ti film 8a and Pt film 8b are deposited over the entire surface of the interlayer film 7 by a sputtering process or CVD process. Further, the PZT film 9 serving as a ferroelectric film is formed on the Pt film 8b by a sol-gel process, MOCVD process or sputtering process. The thickness of the PZT film 9 is preferably about 2000 Å. Then, the lamination of the PZT film 9, Pt film 8b and TiN/Ti film 8a is etched into a desired configuration by using RIE technique.

Figure 7:
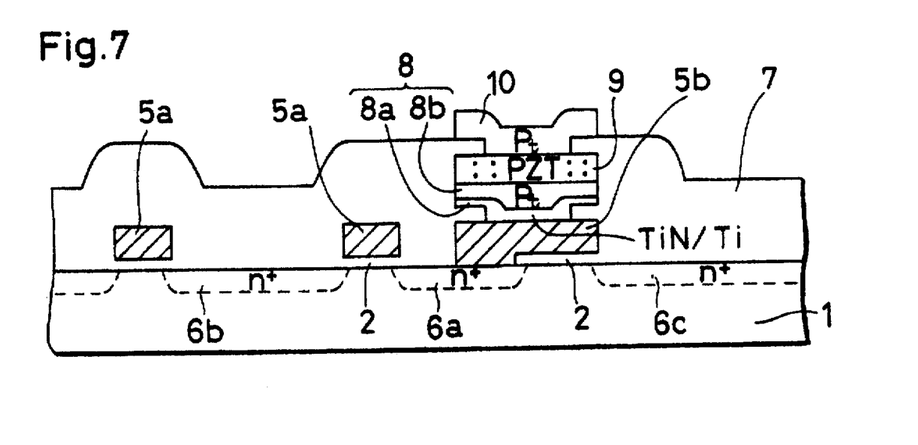

Referring to FIG. 7, the interlayer film 7 of NSG is formed over the lamination, and a contact hole is formed in the interlayer film 7 on the PZT film 9. A Pt film is formed on the interlayer film 7 and patterned into a desired configuration to form the top electrode 10.

The interlayer film 7 is formed on the top electrode 10, and a contact hole is formed in the interlayer film 7 on the impurity diffusion layer 6b. The bit line 11 made of an aluminum-based material is formed on the interlayer film 7 including the contact hole. Thus, the memory cell of FIG. 1 is fabricated.

Figure 8:
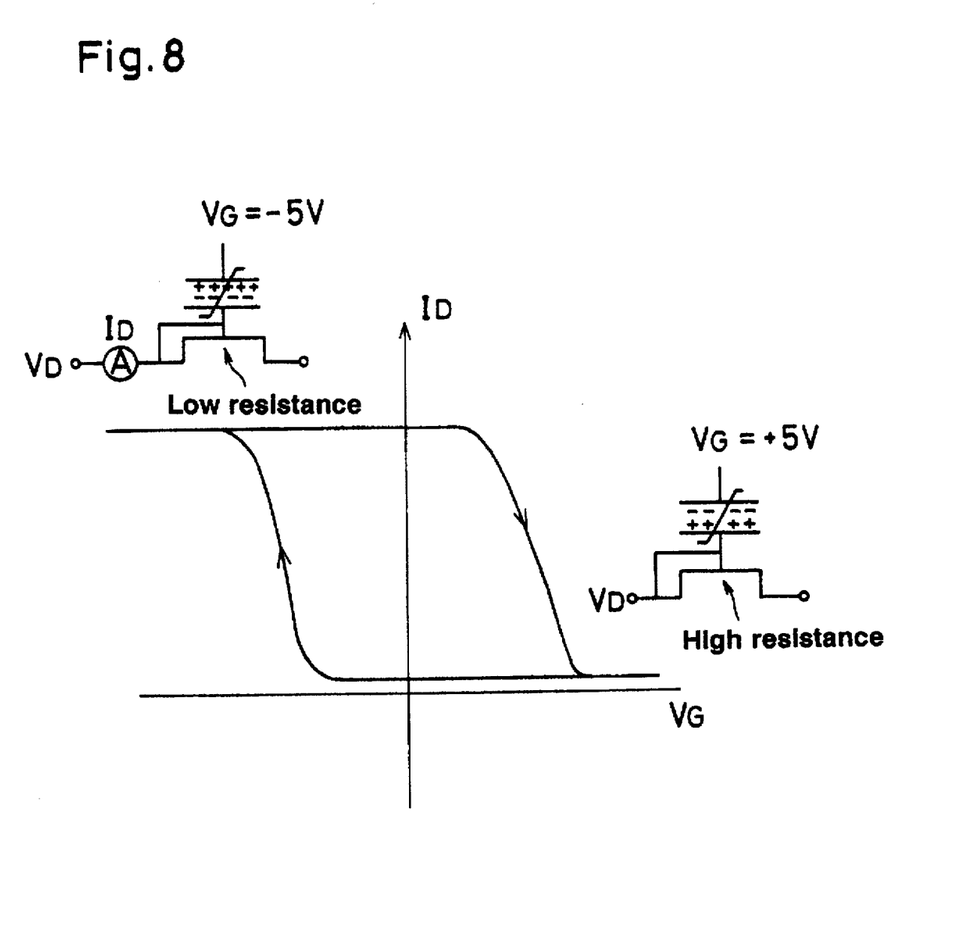
FIG. 8 is a graphical representation illustrating an $I_D$-$V_G$ characteristic of an MFS transistor incorporated in the FRAM in accordance with the present invention.

The $I_D$-$V_G$ (drain current vs. gate voltage) characteristic of the MFS transistor of the FRAM according to the present invention will hereinafter be described. Importance lies in the fact that the voltage applied between the top electrode 10 and the drain is sufficiently impressed upon the capacitor portion because the bottom electrode 8 of the capacitor is connected to the end of the drain which is the impurity diffusion layer 6a.

As shown in FIG. 8, when a gate voltage $V_G$ of −5 V is applied to the top electrode 10, electrons are induced in a channel in a surface portion of the silicon substrate 1 to form an inversion layer in the channel. The result is a large current flow between the source and drain. On the other hand, when a gate voltage $V_G$ of +5 V is applied to the top electrode 10, holes are accumulated in the channel, resulting in no source-drain current flow. In these cases, the PZT film 9 serving as a capacitor insulation film may be kept polarized if the voltage application to the top electrode 10 is stopped. That is, since the inversion/accumulation state of the channel is maintained even when the MFS transistor is off, the polarization provides a binary state of low resistance and high resistance caused by the channel.

For instance, when a voltage of about 5V is applied to the top electrode of the capacitor portion having a 0.2 μm thick PZT film, the PZT film has remanent polarization charge of 20 μc/cm². Where the gate insulation film has a thickness of 0.1 μm, a voltage of about 4.5V is constantly applied to the gate insulation film to form a distinct inversion layer/accumulation layer in the channel in the surface portion of the silicon substrate. Where the MFS transistor has a channel length of 1 μm and a width of 1 μm, the resistance is 10KΩ to 100KΩ in a low resistance state where the inversion layer is formed in the channel, and the resistance is 1TΩ to 10TΩ in a high resistance state where the accumulation layer is formed therein. It should be noted that, since an excessively high resistance reduces the writing speed, the amount of impurity ions in the channel must be controlled so that the resistance does not exceed 1MΩ in the high resistance state.

Figure 9:
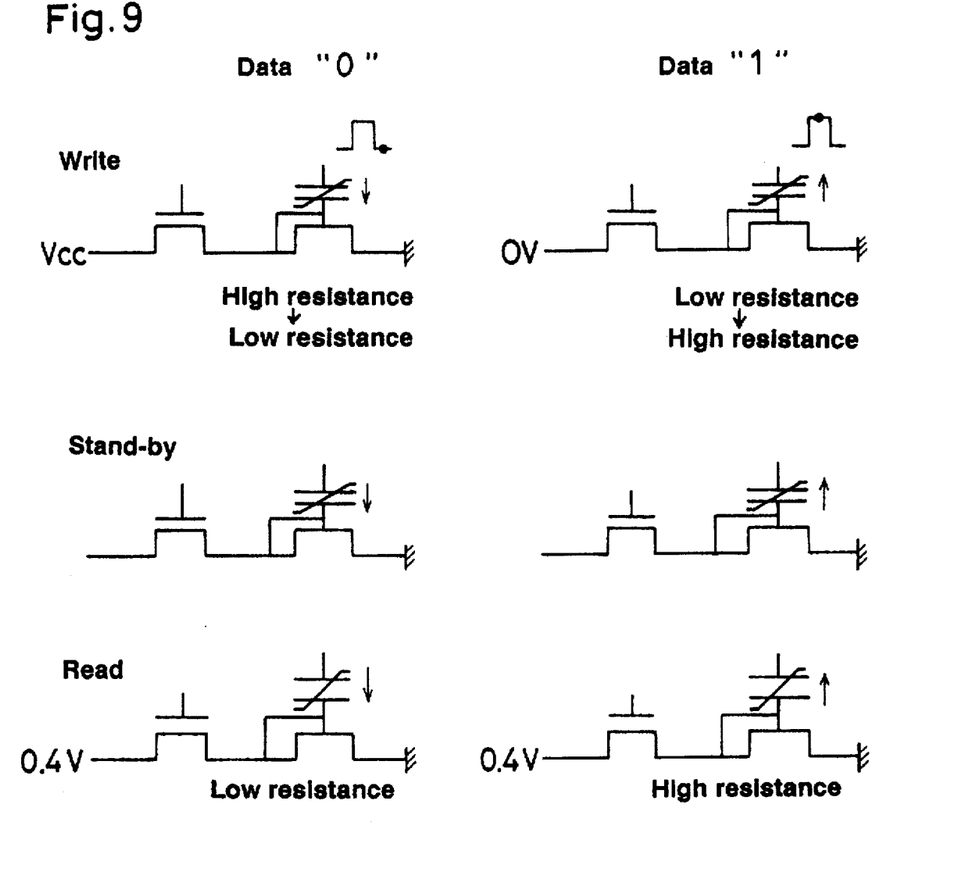
FIG. 9 is an equivalent circuit diagram for explaining the operation of the FRAM in accordance with the present invention.

FIG. 9 shows the principle of operation of the AFRAM according to the present invention.

During a write operation, the select transistor is turned on with a power supply voltage (Vcc) or ground voltage (0V) applied to the bit line, and pulse voltages of 0V, 5V and 0V are sequentially applied to the drive line. With the power supply voltage Vcc applied to the bit line, the inversion layer is formed in the channel of the MFS transistor when the drive line is at 0V to form a low resistance layer. On the other hand, with the ground voltage 0V applied to the bit line, the accumulation layer is formed in the channel when the drive line is at 5V to form a high resistance layer.

Specifically, data "0" and "1" are written based on the distinction between the low-resistance and high-resistance states of the MFS transistor. In this case, the bottom gate electrode of the MFS transistor which also acts as the bottom electrode of the capacitor portion is directly connected to the impurity diffusion layer of the MFS transistor to allow the capacitor to receive a sufficient voltage (approximately Vcc), readily achieving saturation polarization in the ferroelectric film of the capacitor. As a result, a distinct low-resistance/high-resistance layer is formed in the channel of the MFS transistor.

During standby, the ground voltage (0 V) is applied to the bit line and drive line.

During a read operation, the source of the MFS transistor is grounded, and the bit line is precharged up to 0.4V. When the select transistor is subsequently turned on, the MFS transistor is of low resistance with the data "0" to cause a current flow, decreasing the potential of the bit line. On the other hand, with the data "1", the MFS transistor is of high resistance which makes it difficult to cause a current flow and the decrease in potential of the bit line.

Figure 10:
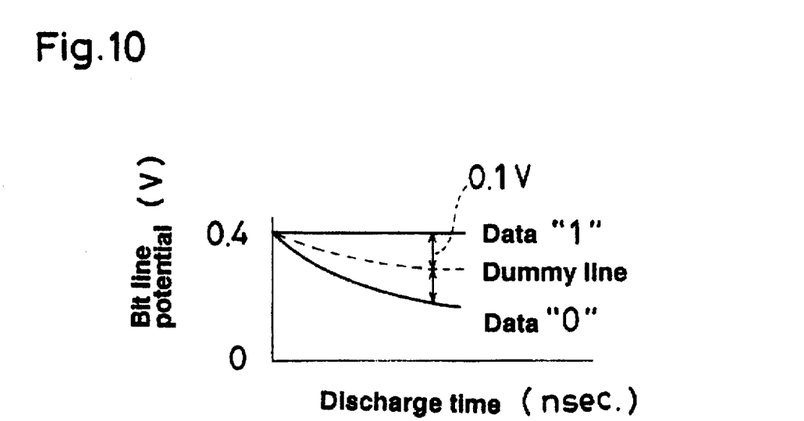
FIG. 10 is a graphical representation showing the relation between a bit line voltage and a discharge time during a data read operation of the FRAM in accordance with the present invention.

FIG. 10 shows variations in potential of the bit line during the read operation in the aforesaid simulation. In accordance with the simulation of FIG. 10, a potential difference between a state with the data "0" and a state with the data "1" reaches about 200 mV after 10 nsec. When a reference (dummy cell) is set at an intermediate potential, a potential difference of about 100 mV occurs between the reference state and the state with the data "0" or between the reference state and the state with the data "1". It is, hence, appreciated that a typical current-mirror sense amplifier may be used to sense the signal. According to this simulation, the sensing is permitted when the ratio of high resistance to low resistance is not less than 10. Since it is difficult to generate a voltage as low as 0.4V on the bit line, a potential difference may be produced between the memory cells by setting the bit line at 1.6V and setting the common source line (source line) at about 1.2V, for example. The greater the potential difference, the shorter the signal detecting time. However, the potential difference is preferably about 0.2V to about 0.8V in consideration for the likelihood of unstable polarization.

Figure 11:
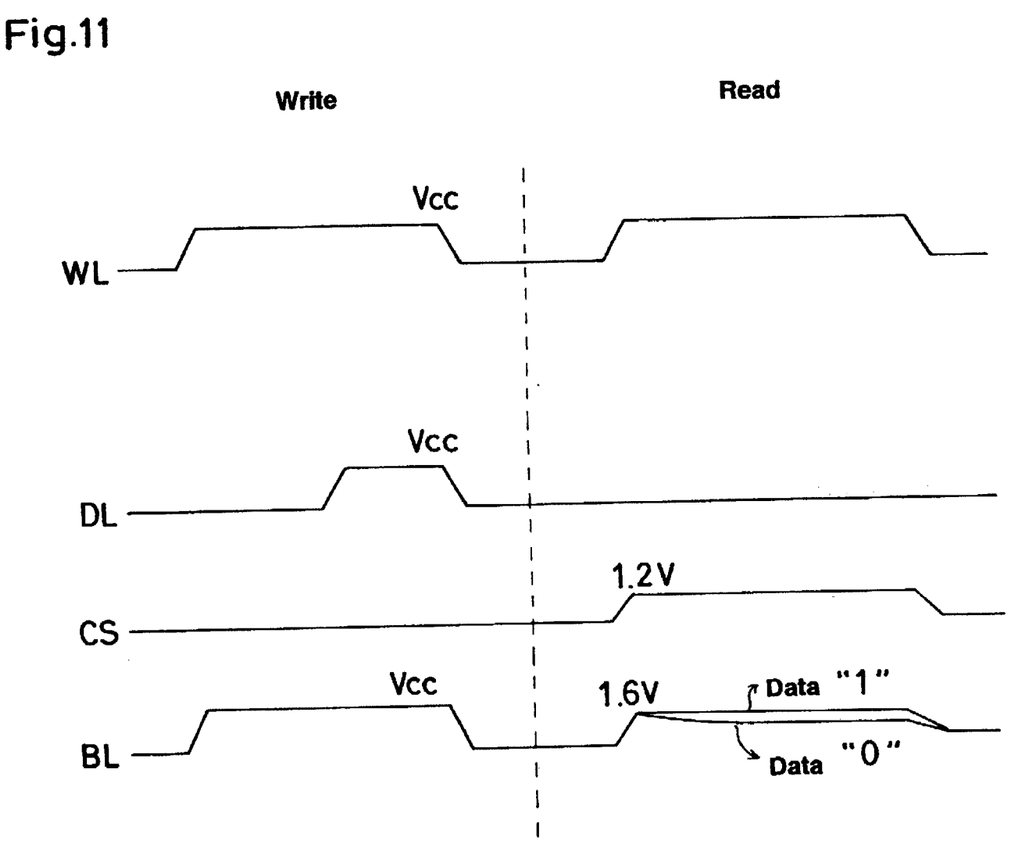
FIG. 11 is a timing chart for the operation of the FRAM in accordance with the present invention.

FIG. 11 is an exemplary timing chart of the operation of the FRAM according to the present invention. In this example, pulse voltages of 1.6V and 1.2V are applied to the bit line BL and the common source line CS, respectively, during the read operation to generate a potential difference of 0.4V.

The read operation described above allows for data read without data destruction while holding the polarization. This requires no rewriting unlike the conventional FRAM and simplifies the circuit arrangement. Further, the voltages applied to the bit line and drive line are low during the read operation to generate no transient current by the polarization inversion, significantly reducing current consumption. A high-speed read operation can be realized which is comparable to SRAMs. The non-destructive read operation significantly reduces specification requirements for the film fatigue of the ferroelectric film in comparison with the conventional FRAM.

Figure 12:
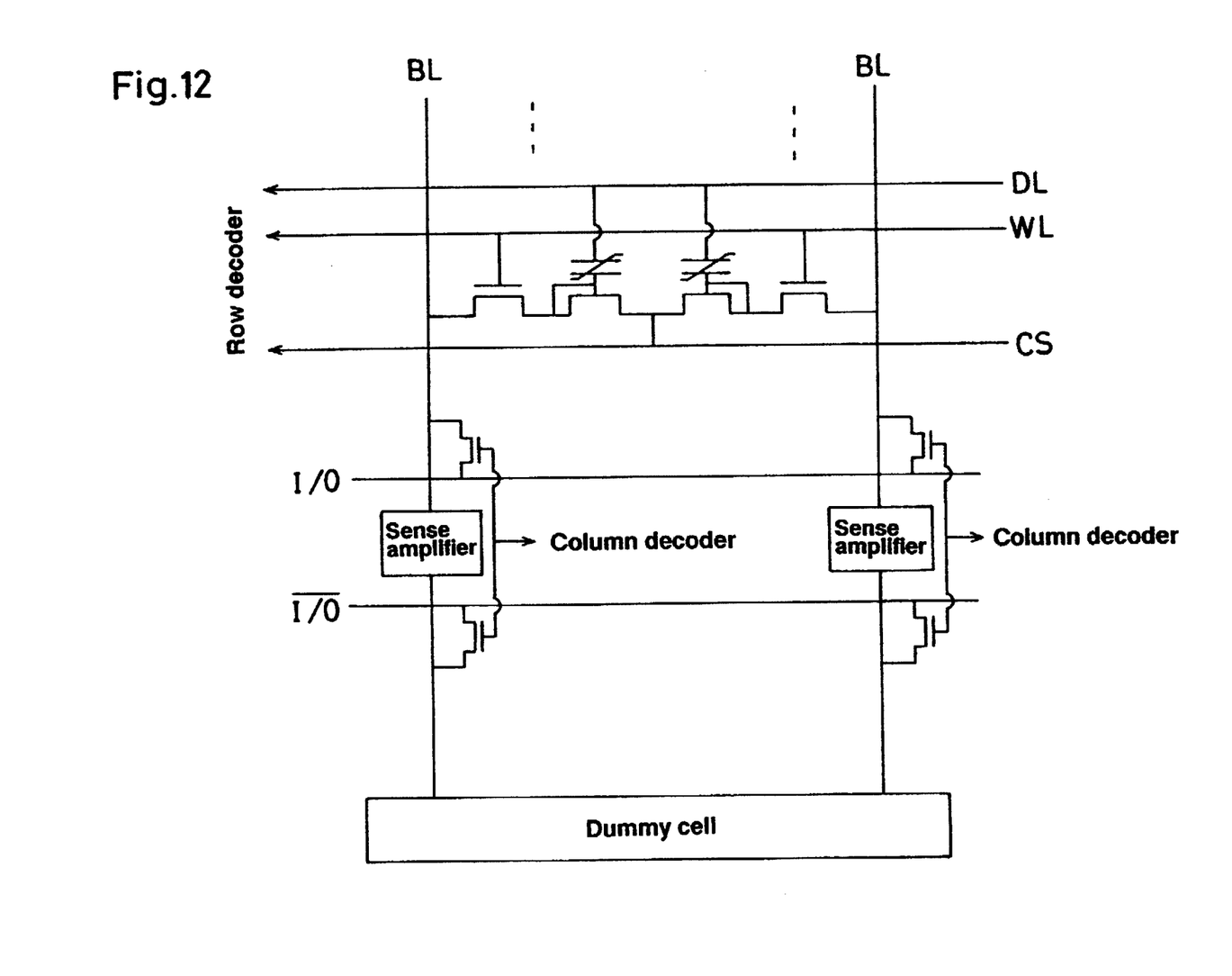
FIG. 12 is an equivalent circuit diagram of the FRAM in accordance with the present invention.

FIG. 12 is an equivalent circuit diagram of the FRAM according to the present invention which basically has an open bit system. The FRAM has a cell size which is 1 to 1.2 times that of a typical FRAM, but has simple peripheral circuits. Thus, the FRAM of FIG. 12 has a smaller chip size than the typical FRAM. The drive line DL, word line WL, and common source line CS are connected to a row decoder. The pair of bit lines are diverged toward the sense amplifier, and dummy cells are arranged on opposite side of the memory cell array. The dummy cell should be designed to produce an intermediate potential level between the level with the data "0" and the level with the data "1" by short-circuiting a high-resistance cell and a low-resistance cell or exhibiting an intermediate resistance. In the mega-bit class memory, 128 to 256 memory cells are connected to one bit line.

In this manner, the FRAM according to the present invention eliminates a destructive read operation as required for the typical FRAM and the need to apply a high voltage to the capacitor portion, preventing the film fatigue of the dummy cell and the imprint problem. Thus, the FRAM according to the present invention allows for a non-destructive read operation and reduction in voltage applied during the read operation, thereby preventing the deterioration thereof due to film fatigue and improving imprint resistance.

Figure 13:
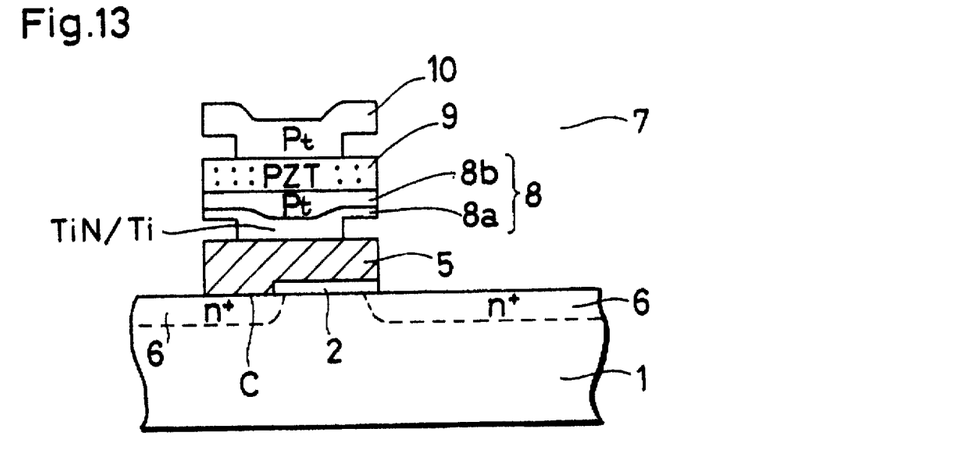
FIG. 13 is a schematic sectional view illustrating a memory cell of the FRAM in accordance with a second embodiment of the present invention.

FIG. 13 shows the FRAM according to a second embodiment of the present invention. The FRAM has a memory cell essentially consisting of the MFS transistor. The MFS transistor includes a pair of impurity diffusion regions 6, and a bottom gate electrode 5 having the direct connection C with a portion of one of the impurity diffusion regions 6 and formed on the gate insulation film 2 in a portion other than the connection. A capacitor portion is formed on the bottom gate electrode 5 of the MFS transistor. The capacitor portion includes a bottom electrode 8, a PZT film 9 formed on the bottom electrode 8, and a Pt film 10 formed on the PZT film 9. The bottom electrode 8 has a TiN/Ti film 8a directly connected to the bottom gate electrode 5 and a Pt film 8b formed on the TiN/Ti film 8a. In the memory cell thus arranged, one of the impurity diffusion regions 6 of the MFS transistor is connected to a bit line (not shown), the other impurity diffusion region 6 is connected to a common source line CS, and the top electrode 10 of the capacitor portion is connected to a drive line DL.

In the FRAM of FIG. 13, the bottom gate electrode of the MFS transistor which also acts as the bottom electrode of the capacitor portion is directly connected to one of the impurity diffusion regions of the MFS transistor. This allows a sufficient voltage to be applied to the capacitor, so that the ferroelectric film of the capacitor readily reaches the saturation polarization. Thus, current consumption can be significantly reduced.

In accordance with the present invention, one MOS transistor and one MFS transistor device constitute one FRAM cell. This provides for a non-volatile memory presenting a high integration level comparable to DRAMs, and low power consumption and high speed operation comparable to SRAMs.

Additionally, the non-destructive data read operation at a low voltage provides for a highly reliable device which is less susceptible to imprint and film fatigue than the conventional FRAM.

What is claimed is:

1. A non-volatile random access memory which comprises a memory cell including:

a MOS transistor having a gate insulation film formed on a semiconductor substrate, a gate electrode, and a pair of impurity diffusion regions; and an MFS transistor having at least a gate insulation film, a bottom gate electrode, a ferroelectric film, a top electrode, and a pair of impurity diffusion regions, the gate insulation film being formed immediately under a portion of the bottom electrode and between the pair of impurity diffusion regions, and one of the impurity diffusion regions of the MFS transistor being shared with the MOS transistor and connected to a portion of the bottom gate electrode so as to apply a voltage to the bottom gate electrode via the impurity diffusion region;

wherein the MOS transistor is connected to a bit line and a word line, and the MFS transistor is connected to a drive line and a common source line.

2. A non-volatile random access memory of claim 1, wherein the bottom gate electrode of the MFS transistor is made of Pt/TiN/Ti, $RuO_2$/Ru or $IrO_2$/Ir.

3. A non-volatile random access memory of claim 1, wherein the ferroelectric film of the MFS transistor is made of PZT, PLZT, PNZT, $BiSr_2Ta_2O_9$ or $BiSr_2Ta_xN_yO_9$.

4. A non-volatile random access memory of claim 1, wherein the bottom gate electrode of the MFS is formed to extend over and form the connection with said one of the diffusion regions.

5. A non-volatile random access memory which comprises a memory cell including:

a MOS transistor portion having a gate insulation film and a bottom gate electrode formed on the semiconductor substrate, and a pair of impurity diffusion regions, said gate insulation film being formed immediately under a portion of the bottom gate electrode and between the pair of impurity diffusion regions;

a ferroelectric capacitor portion, formed on the MOS transistor portion, having the bottom gate electrode serving as a bottom electrode, a ferroelectric film and a top electrode, wherein the bottom gate electrode is connected to one of the impurity diffusion regions so as to apply a voltage to the bottom gate electrode via the impurity diffusion regions.

6. A non-volatile random access memory of claim 5, wherein the bottom electrode is made of Pt/TiN/Ti, $RuO_2$/Ru or $IrO_2$/Ir.

7. A non-volatile random access memory of claim 5, wherein the ferroelectric film is made of PZT, PLZT, PNZT, $BiSr_2Ta_2O_9$ or $BiSr_2Ta_xN_yO_9$.

8. A non-volatile random access memory of claim 5, wherein the bottom gate electrode of the MFS is formed to extend over and form the connection with said one of the diffusion regions.

* * * * *